United States Patent
Yuzurihara et al.

[11] Patent Number: 5,700,719
[45] Date of Patent: Dec. 23, 1997

[54] SEMICONDUCTOR DEVICE AND METHOD FOR PRODUCING THE SAME

[75] Inventors: Hiroshi Yuzurihara, Isehara; Shunsuke Inoue, Atsugi; Mamoru Miyawaki, Tokyo; Shigeyuki Matsumoto, Atsugi, all of Japan

[73] Assignee: Canon Kabushiki Kaisha, Tokyo, Japan

[21] Appl. No.: 414,049

[22] Filed: Mar. 30, 1995

Related U.S. Application Data

[60] Continuation of Ser. No. 22,931, Feb. 26, 1993, abandoned, which is a division of Ser. No. 705,596, May 24, 1991, Pat. No. 5,218,232.

[30] Foreign Application Priority Data

May 31, 1990 [JP] Japan ................... 2-139612

[51] Int. Cl.$^6$ ................... H01L 21/443
[52] U.S. Cl. ................... 437/193; 437/194; 148/DIG. 20
[58] Field of Search ................... 437/193, 194, 437/200; 148/DIG. 20

[56] References Cited

U.S. PATENT DOCUMENTS

| | | | |
|---|---|---|---|
| 4,328,261 | 5/1982 | Heinecke et al. | 437/245 |
| 4,562,640 | 1/1986 | Widmann et al. | 437/189 |
| 4,648,175 | 3/1987 | Metz, Jr. et al. | |
| 4,800,176 | 1/1989 | Kakumu et al. | 437/193 |
| 4,833,094 | 5/1989 | Kenney | 437/47 |
| 4,851,257 | 7/1989 | Young et al. | |
| 5,084,417 | 1/1992 | Joshi et al. | 437/192 |
| 5,179,042 | 1/1993 | Mikoshiba et al. | 437/187 |

FOREIGN PATENT DOCUMENTS

| | | |
|---|---|---|
| 098737A2 | 1/1984 | European Pat. Off. . |
| 0123309 | 10/1984 | European Pat. Off. ........ H01L 21/60 |
| 0163132 | 12/1985 | European Pat. Off. ........ H01L 27/10 |
| 2537564 | 3/1976 | Germany . |
| 59-057469 | 3/1984 | Japan . |
| 2-38569 | 2/1990 | Japan . |

OTHER PUBLICATIONS

S. K. Ghandhi *VLSI Fabrication Principles* (1983) p. 439.

M. Hanabusa et al. *Japanese Journal of Applied Physics* vol. 27 No. 8 (Aug. 1988) pp. L1392–L1394. Provided by Applicant.

"Photochem. Vapor Dep. of Al Thin Films Using DMAH". Patent Abstracts of Japan, vol. 9, No. 106 (E-313), 10 May 1985; & JP-A-59 231 871.

"Photochemical Vapor Deposition of Aluminum Thin Films Using Dimethylaluminum Hydride", Mitsugu Hanabusa et al., Japanese Journal of Applied Physics, vol. 27, No. 8, Aug., 1988, pp. L1392–L1394.

*Primary Examiner*—John Niebling
*Assistant Examiner*—C. Everhart
*Attorney, Agent, or Firm*—Fitzpatrick, Cella, Harper & Scinto

[57] ABSTRACT

A semiconductor device, wherein an electrode wiring, which is in contact with semiconductor layers of mutually different conductive types and serves to connect at least he layers of mutually different conductive types, comprises a first portion principally composed of a component same as the principal component of the semiconductor layers, and a second portion consisting of a metal.

15 Claims, 11 Drawing Sheets

SEMICONDUCTOR DEVICE AND METHOD FOR PRODUCING THE SAME

This application is a continuation of application Ser. No. 08/022,931 filed Feb. 26, 1993, now abandoned, which is a division of application Ser. No. 07/705,596 filed May 24, 1991 U.S. Pat. No. 5,218,232.

BACKGROUND OF THE INVENTION

1. Field of the Invention

The present invention relates to a semiconductor integrated circuit device such as a memory or a single processing device for use in various electronic appliances, and a method for producing the same.

2. Related Background Art

A doped polysilicon layer has been used as a wiring material for various semiconductor devices, as a gate material for a MOSFET, or as an impurity diffusion source. Such doped polysilicon has contained impurities of a single conductive type, in consideration of easing the manufacturing process.

However, when polysilicon is used as the gate material of a CMOSFET of conventional structure, the electrodes are of the same conductive type, such as n-polysilicon for both NMOSFET and PMOSFET, and the threshold voltages of the two may not be mutually matched.

Also in the case of a circuit composed of NPN and PNP transistors, polysilicon of only one conductive type can be used, as the emitter diffusion source, in either transistor.

In addition, polysilicon has been associated with drawbacks giving rise to large chip size and a loss in the level for integration, because of its high resistance, requiring a large cross-sectional area for reducing the resistance of the wiring.

SUMMARY OF THE INVENTION

In consideration of the foregoing, the object of the present invention is to increase the freedom of use of polysilicon of different conductive types, or the freedom in circuit design, and to reduce the chip size thereby improving the level of integration of semiconductor devices.

The semiconductor device of the present invention is featured by an electrode wiring provided in contact with semiconductor layers of mutually different conductive types and serving at least connect the areas of said different conductive types. The electrode wiring comprises a first portion principally composed of a component the same as the principal component of the semiconductor layers, and a second portion composed of a metal.

Also the method of the present invention is featured by forming a first layer bridging two areas of a semiconductor substrate, exposed in at least two apertures in an insulation film formed on the surface of the semiconductor substrate, with the first layer being principally composed of a component the same as the principal component of the semiconductor, and depositing Al or a metal principally composed of Al selectively on the doped polycrystalline Si layer.

According to the present invention, a metal film is selectively deposited on silicon having different conductive types. It is therefore rendered possible to reduce the wiring resistance, to improve the level of integration, and to improve the freedom in circuit design.

DETAILED DESCRIPTION OF THE PREFERRED EMBODIMENTS

Now, the present invention will be clarified in detail by preferred embodiments thereof.

Figure 1A:
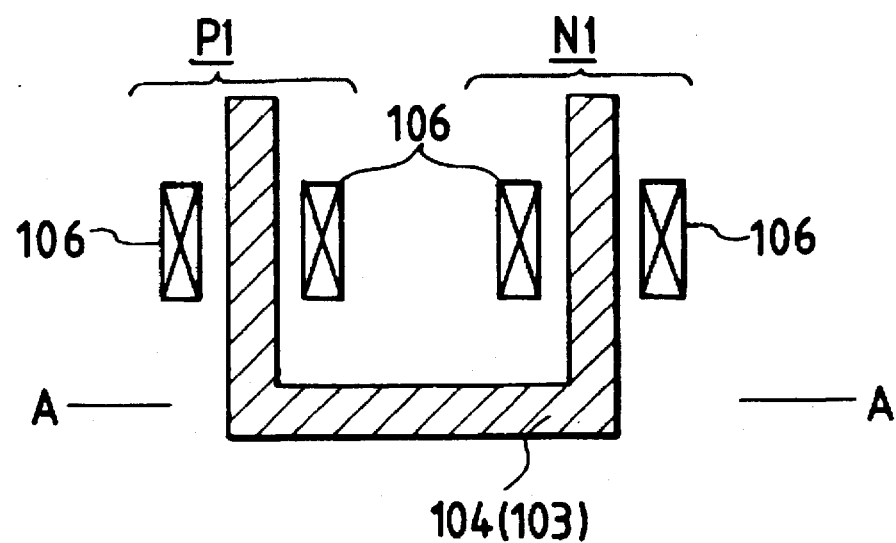
FIGS. 1A and 1B are schematic views showing the principle of the present invention.
Figure 1B:
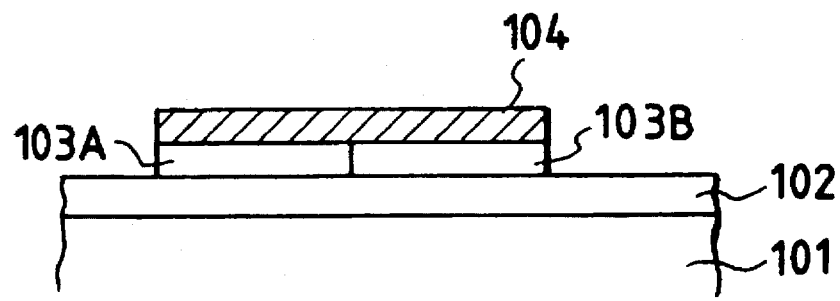

FIGS. 1A and 1B are respectively a plan view and a cross-sectional view along a line A—A' in FIG. 1A, schematically showing a CMOSFET involving a laminate structure of a polysilicon layer and a metal layer of the present invention. On a semiconductor substrate 101, a PMOS device (P1) and an NMOS device (N1) are formed to constitute a CMOS circuit. On an oxide film 102, there is formed a laminate electrode wiring consistent of a single polysilicon layer 103 and a metal layer 104, serving as the gate electrodes and wirings for both devices, and source-drain electrodes 106 are further formed. The single polysilicon layer 103 is doped in p-type to be a portion 103A at the side of the PMOS device, and, on the entire area of the polysilicon layer, there is deposited selectively a metal layer 104 composed of Al or principally of Al, or of another metal such Cu, Mo or W. A multi-layered wiring may also be obtained by opening a through-hold in an arbitrary position in an insulation film (not shown) formed on the metal wiring layer 104, selectively deposition metal in the through-hole, and forming another wiring on the insulation film.

More specifically, a laminate structure of a metal and a material principally composed of a component the same as the principal component (Si in this case) constituting the semiconductor device can be obtained by the above-explained selective deposition, and the multi-layered wiring structure can be obtained by effecting the selective deposition and the non-selective deposition of the conductive materials in succession according to necessity.

Preferred examples of the metal principally composed of Al include Al—Si, Al—Ti, Al—Cu, Al—Si—Ti and Al—Si—Cu.

The polysilicon layer may have an undoped portion between the p- and n-doped portions. Also a silicide layer may be formed on the polysilicon, prior to selective deposition of metal film.

The doping of the polysilicon layer may be conducted in the ion implantation step for forming the source-drain areas of the MOSFET, or in another separate step. Also the lead electrode for the source-drain area may be composed of a multi-layered film composed of polysilicon and Al—Si.

The laminate structure of polysilicon and metal may be employed in the lead electrode for the emitter and/or collector of a bipolar transistor.

As examples of usable metal, selective deposition of Cu can be achieved with copper bisacetylacetaonate, Mo with $Mo(CH_3)_6$, or W with $W(CH_3)_6$, on polysilicon.

IN the following there will be explained a deposition method suitable for forming a metal layer for the electrode wiring of the present invention.

[Film forming method]

In the following there will be explained a film forming method of the present invention, suitable for forming an electrode.

This method is adapted for filling an aperture with a conductive material, for forming the electrode of the above-explained structure.

The film forming method consists of forming a deposited film by a surface reaction on an electron donating substrate, utilizing alkylaluminum hydride gas and hydrogen gas (the method being hereinafter called Al—CVD method). An aluminum film of satisfactory quality can be deposited by heating the surface of the substrate in the present of a gaseous mixture particularly consisting of monomethylaluminun hydride (MMAH) or dimethylaluminum hydride (DMAH) as the raw material gas and hydrogen as the reaction gas. For the selective Al deposition, the substrate surface is preferably maintained at a temperature at least equal to the decomposition temperature of alkylaluminum hydride but lower than 450° C., more preferably between 260° C. and 440° C., by direct or indirect heating.

The heating of the substrate in the above-mentioned temperature range may be achieved by direct or indirect heating, but formation of an Al film of satisfactory quality can be achieved with a high deposition speed particularly by direct heating. For example, with the more preferred temperature range of 260°–340° C., a satisfactory film can be obtained with a deposition speed of 300–5000 Å/min. which is higher than with resistance heating. Such direct heating (the substrate being heated by direct transmission of energy from the heating means) can be achieved by heating with a lamp such as a halogen lamp or a xenon lamp. Also indirect heating may be achieved for example by resistance heating, conducted by a heat generating member provided in a substrate support member for supporting the substrate to be subject to film deposition, provided in a film depositing space.

This method, if applied to a substrate having both an electron donating surface area and an electron non-donating surface area, allows formation of a single crystal of aluminum with satisfactory selectivity solely ont he electron donating surface area. Such aluminum is excellent in all the properties required for electrode/siring material, including a low hillock frequency and a low alloy spike frequency.

This is presumably because the semiconductive or conductive surface constituting an electron donating surface can selectively develop an aluminum film of satisfactory quality and the excellent crystalline character of the Al film excludes or significantly reduces the alloy spike formation etc. resulting from an eutectic reaction with the underlying silicon. Such Al film, when employed as a electrode of a semiconductor device, provides advantages far exceeding the concept of the conventional Al electrode and is not anticipated int he prior technology.

As explained above, the Al deposited in an aperture with an electron donating surface, for example an aperture formed in an insulating film and exposing the surface of a semiconductor substrate therein, has a monocrystalline structure. Besides the Al—DVD method can achieve selective deposition of following metal films principally composed of aluminum, with similarly satisfactory quality.

For example, the electrode may be formed by selective deposition of various conductive materials such as Al—Si, Al—Tri, Al—Cu, Al—Si—Ti or All—Si—Cu by the use of a mixed gaseous atmosphere employing, in addition to alkylaluminum hydride gas and hydrogen, a suitable combination of:

Si—containing gas such as $SiH_4$, $Si_2H_6$, $Si_3H_8$, $Si(CH_3)_4$, $SiH_2Cl_2$ or $SiHCl_3$;

Ti-containing gas such as $TiCl_4$, $TrBr_4$ or $Ti(CH_3)_4$; and/or

Cu-containing gas such as copper bisacetylacetonate $Cu(C_5H_7O_2)_2$, copper bisdipyvaloylmethanite $Cu(C_{11}H_{19}O_2)_2$ or copper bishexafluoroacetylacetonate $Cu(C_5HF_6O_2)_2$.

Also since the Al—CVD method is excellent in selectivity and provides satisfactory surface characteristics ont he deposited film, there can be obtained a metal film suitable and widely usable for the wirings of a semiconductor device, by employing a non-selective film forming method in a next deposition step to form a metal film composed solely or principally of aluminum not only on the selectively deposited aluminum film mentioned above but also on the $SiO_2$ insulation film.

Examples of such metal films include combinations of selectively deposited Al, Al—Si, Al—Ti, Al—cu, Al—Si—Ti or Al—Si—Cu and non-selectively deposited Al, Al—Si, Al—Ti, Al—Cu, Al—Si—Ti or Al—Si—Cu. Said non-selectively film deposition may be achieved by CVD other than the aforementioned Al—CVE, or by sputtering.

[Film forming apparatus]

IN the following there will be explained a film forming apparatus suitable for the electrode formation according to the present invention.

Figure 2:
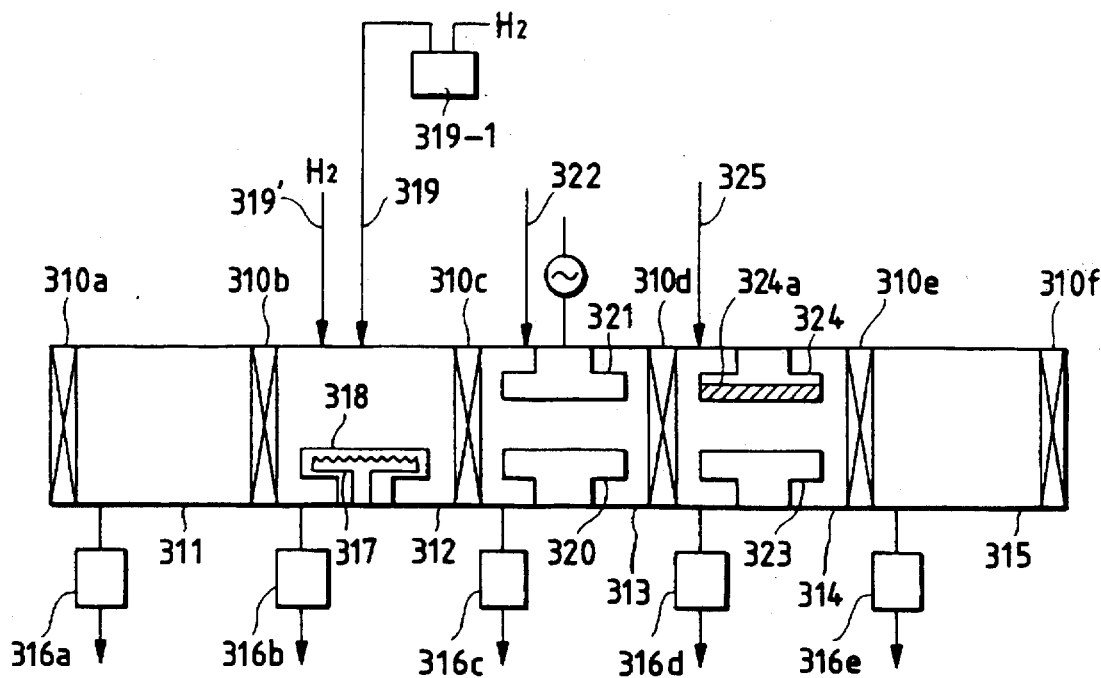
FIGS. 2 to 5 are views showing an example of the apparatus adapted for use in the method of the present invention for producing the semiconductor circuit device.
Figure 3:
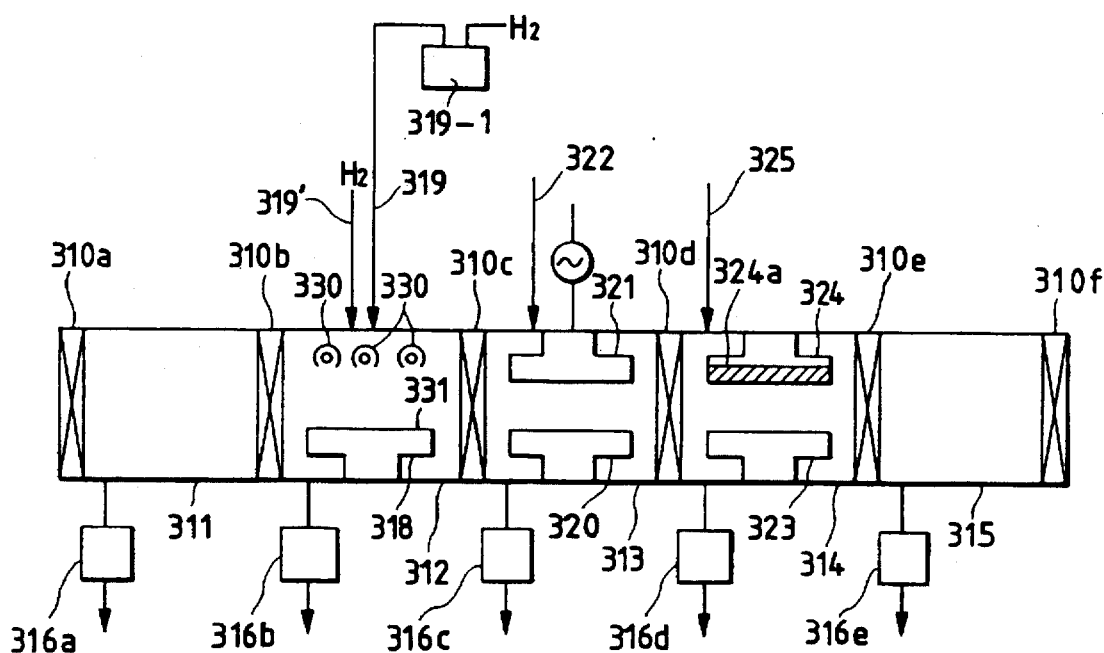
Figure 4:
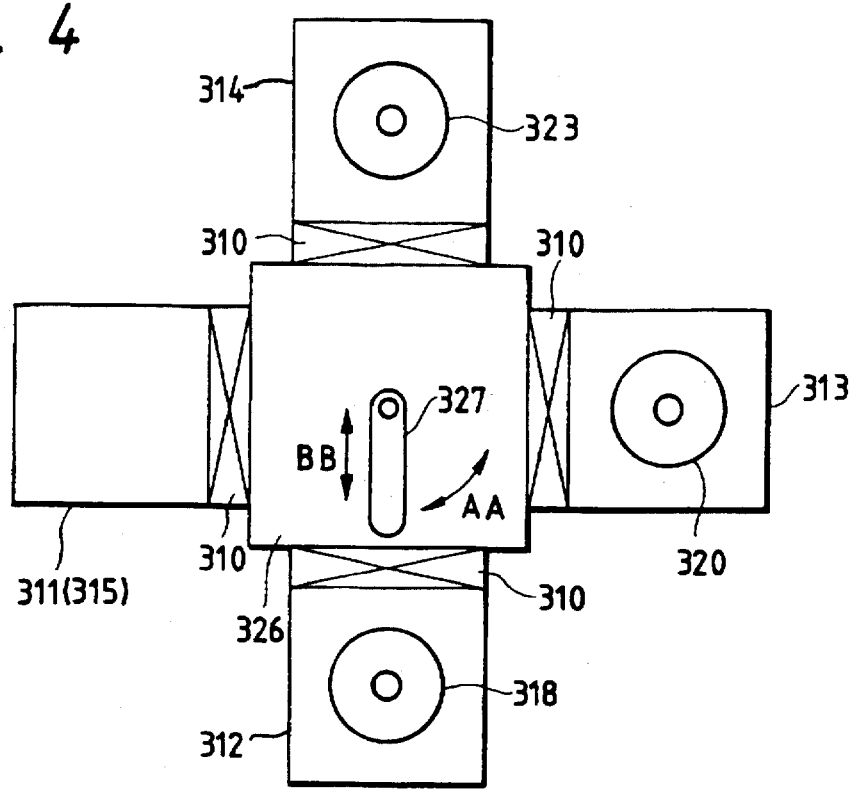

FIGS. 2 to 4 schematically illustrate a continuous metal film forming apparatus suitable for executing the film forming method explained above.

As shown in FIG. 2, said apparatus is composed of a load lock chamber 311, a CVD reaction chamber (first film forming chamber) 312, an Rf etching chamber 313, a sputtering chamber (second film forming chamber) 314 and a load lock chamber 135, which are rendered sealable from the external atmosphere and mutually communicatable by means of gate valves 310a–310f and can be respectively evacuated or reduced in pursue by vacuum systems 316a316e. The load lock chamber 311 is used for eliminating the atmosphere of the substrate and replacing it with $H_2$ prior to the deposition, in order to improve the through put. The next CVD reaction chamber 312, for selective deposition onto the substrate under normal or reduced pressure, is provided therein with s substrate holder 318 having a resistance heater 317 for heating the substrate surface subjected to film formation at least within a temperature renege of 200°–450° C., and receives the raw material gas such as alkylaluminum hydride, which is gasified by bubbling with hydrogen in a bubbler 319-1, through a raw material gas supply line 319, and hydrogen s the reaction gas through a gas line 319'. The Rf etching chamber 313, for cleaning (etching) of the substrate surface in an Ar atmosphere after the selective deposition, is provided therein with a substrate holer 320 capable of heating the substrate at least within range of 100°–250° C. and an Rf etching electrode line 321, and is connected to an Ar gas supply line 322. the sputtering chamber 314, for non-selective deposition of a metal film by sputtering in an Ar atmosphere, is provided therein with a substrate holder 323 to be heated at least within a range of 200°–250° C. and a target electrode 324 for mounting a sputtering target 324a, and is connected to an Ar gas supply line 325. The final load lock chamber 315, for adjustment of the substrate after metal film deposition and prior to the exposure to the external atmosphere, is designed to capable of replacing the atmosphere with N.

FIG. 3 shows another example of the continuous metal film forming apparatus, wherein the same components as those in FIG. 2 are represented by the same numbers. The apparatus in FIG. 3 is different from that in FIG. 2 in that the substrate surface is directly heated by halogen lamps 330, and, for this purpose, the substrate holder 312 is provided with projections 331 for supporting the substrate in a floating state.

Direct heating of the substrate surface with such structure further increases the deposition speed as explained before.

Figure 5:
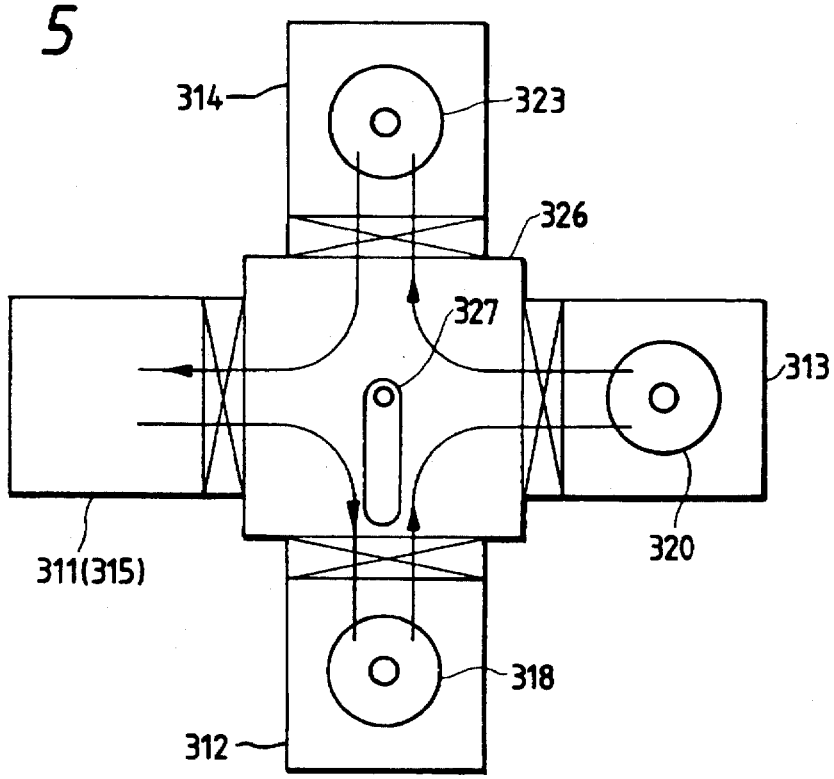

The continuous metal film forming apparatus of the above-explained structure is equivalent, in practice, to a structure shown in FIG. 4, in which the load lock chamber 311, CVD reaction chamber 312, Rf etching chamber 313, sputtering chamber 314 and load lock chamber 315 are mutually combined by a transport chamber 326. In this structure, the load lock chamber 311 serves also as he chamber 315. In this transport chamber 326, there is provided an arm 327 constituting transport means, rotatable in both directions A—A and extendable and retractable in direction B—B, whereby the substrate can be transferred in succession from the load lock chamber 311 to the CVD reaction chamber 312, Rf etching chamber 313, sputtering chamber 314, and finally to the load lock chamber 315 without exposure to the external atmosphere, as indicated by arrows in FIG. 5.

[Film forming process]

Now there will be explained the film forming process for forming the electrodes and wirings according to the present invention.

FIG. 6 illustrates the film forming procedure for forming the electrodes and wirings according to the present invention, in schematic perspective views.

At first the outline of the procedure will be described. A semiconductor substrate with an insulating film having apertures therein is placed in the film forming chamber, and the surface thereof is maintained for example at 250°–450° C. Thermal CVD conducted in a mixed atmosphere of DMAH gas as alkylaluminum hydride and hydrogen gas causes selective deposition of Al on the semiconductor exposed in the apertures. There my naturally be conducted selective deposition of a metal film principally composed of Al, for example Al—Si, by introduction for example of Si-containing gas, as explained before. Then a metal film composed solely or principally of Al is non-selectively formed by sputtering on the selectively deposited Al and on the insulation film. Subsequently the non-selectively deposited metal film is patterned into the shape of desired wirings, thereby obtaining the electrodes and the wirings.

This procedure will be explained in greater details with reference to FIGS. 3 and 6. At first the substrate is prepared, consisting for example of a monocrystalline silicon wafer bearing thereon an insulation film, in which apertures of different sizes are formed.

Figure 6A:
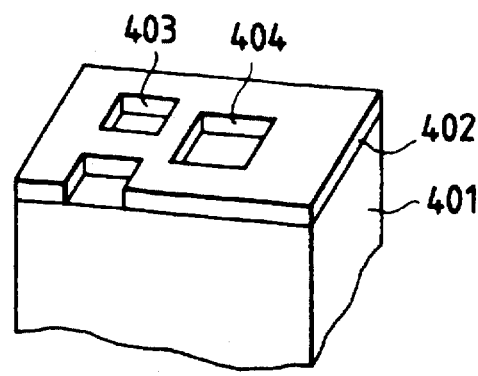
FIGS. 6A to 6D are schematic perspective views showing the steps for forming a first wiring layer in the method of the present invention.

FIG. 6A schematically shows a part of the substrate, wherein shown are a monocrystalline silicon substrate 401 constituting a conductive substrate; a thermal silicon oxide film 402 constituting an insulation film; and apertures 403, 404 of different sizes.

The formation of Al film, constituting a first wiring layer, on the substrate is conducted in the following manner, with the apparatus shown in FIG. 3.

At first the above-explained substrate is place in the load lock chamber 311, in which a hydrogen atmosphere is established by introduction of hydrogen as explained before. Then the reaction chamber 312 is evacuated by the vacuum system 316b approximately to $1\times10^{-8}$ Torr, though Al film formation is still possible with a higher pressure.

Then DMAH gas obtained by bubbling is supplied from the gas line 319, utilizing $H_2$ as the carrier gas.

Also hydrogen as the reaction gas is introduced from the second gas line 319', and the interior of the reaction chamber 312 is maintained at a predetermined pressure, by the adjustment of an unrepresented slow leak valve. A typical pressure is about 1.5 Torr. DMAH is introduced into the reaction chamber from the DMAH line, with a total pressure of about 1.5 Torr and a DMAH partial pressure of about $5.0\times10^{03}$ Torr. Then the halogen lamps 330 are energized to directly heat the wafer, thereby causing selective Al deposition.

After a predetermined deposition time, the DMAH supply is interrupted. This deposition time is selected so that the Al film on Si (monocrystalline silicon substrate 1) becomes as thick as the $SiO_2$ (thermal silicon oxide film 2), and can be experimentally determined in advance.

Figure 6B:
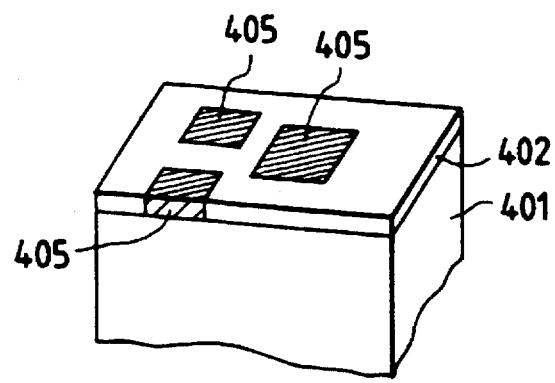

In this process, the substrate surface is heated to ca. 270° C. by direct heating, and the procedure explained above causes selective deposition of an Al film 405 in the aperture, as shown in FIG. 6B.

The foregoing is called a first film forming step for forming an electrode in an aperture.

After said first film forming step, the CVD reaction chamber 312 is evacuated, by the vacuum system 316b, to a pressure not exceeding $5\times10_{-3}$ Torr. Simultaneously the Rf etching chamber 313 is evacuated to a pressure not exceeding $5\times10^{-6}$ Torr. After confirmation of the evacuation of the chambers, the gate valve 310c is opened, then the substrate is moved from the CVD reaction chamber 312 to the Rf etching chamber 313 by the transport means, and the gate valve is closed. The Rf etching chamber 313 is evacuated to a pressure not exceeding $10^{-6}$ Torr, and is then maintained in argon atmosphere of $10^{-1}$–$10^{-3}$ Torr by argon supply from the supply line 322. The substrate holder 320 is maintained at ca. 200° C., and an Rf power of 100 W is supplied to the Rf etching electrode 321 for about 60 seconds to generate an argon discharge in said chamber 313, whereby the substrate surface is etched with argon ions and any unnecessary surfacial layer of the CVD deposition film can be eliminated. The etch depth in this case is about 100 Å, corresponding to the oxide film. This surface etching of the CFC deposition film, conducted in the RF etching chamber, amy be dispensed with since the surfacial layer is free from oxygen etc. as the substrate is transported in vacuum. In such case, the Rf etching chamber 313 may serve for varying the temperature within a short time if the temperature is significantly different between the CVD reaction chamber 312 and the sputtering chamber 314.

After the RF etching, the argon supply is terminated, and the Rf etching chamber 313 is evacuated to $5\times10^{-6}$ Torr. Then the sputtering chamber is also evacuated to $5\times10^{-6}$ Torr or lower, and the gate valve 310da is opened. the substrate is transferred from the Rf etching chamber 313 to the sputtering chamber 314 by the transport means, and the gate valve 310d is closed.

Subsequently the sputtering chamber is maintained at argon atmosphere of $10^{-1}$–$10^{-3}$ Torr as in the Rf etching chamber 313, and the substrate holder 323 is maintained at 200°–250° C. Argon discharge is induced by a DC power of 5–10 kW to scrape target of Al or Al—Si (Si: 0.5%) with argon ions, thereby depositing Al or Al—Si onto the substrate with a deposition speed of ca. 10000 Å/min. This is a non-selective deposition step, and is called a second film forming step for forming wirings connected to the electrodes.

After the formation of the metal film of about 5000 Å on the substrate, the argon supply and the DC power application are terminated. The load lock chamber 311 is evacuated to a pressure of $5\times10^{-3}$ Torr or lower, then the gate valve 310e is opened and the substrate is moved. After the gate valve 310e is closed, the load lock chamber 311 is supplied with nitrogen gas to the atmospheric pressure. Subsequently the gate valve 310f is opened and the substrate is taken out.

Figure 6C:
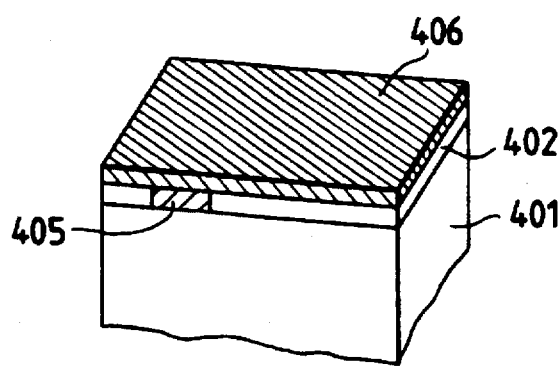

The second Al film deposition step explained above forms an Al film 406 on the SiO$_2$ film 402, as shown in FIG. 6C.

Figure 6D:
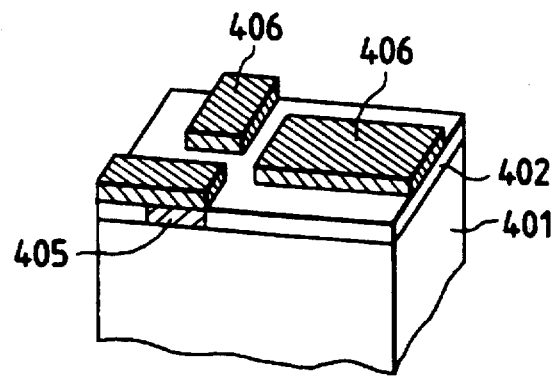

Subsequently the Al film 406 is patterned as shown in FIG. 6D to obtain the wirings of desired shape. A multilayered wiring structure can be obtained by repetition of the above-explained process.

[Experimental examples]

In the following there will be shown experimental results indicating the superiority of the above-explained Al—CVD method and the satisfactory quality of the Al film deposited by said method in the apertures.

There were prepared plural substrates, each consisting of an N-type monocrystalline silicon wafer, provided thereon with a thermally oxidized SiO$_2$ film of a thickness of 8000 Å, in which apertures of different sizes form 0.25×0.25 μm to 100×100 μm were formed by patterning to expose the underlying monocrystalline silicon (samples 1-1).

These samples were subjected to the Al film formation by the Al—CVD method, employing DMAH as the raw material gas and hydrogen as the reaction gas, with a total pressure of 1.5 Torr and DMAH partial pressure of $5.0\times10^{-3}$ Torr, and with the substrate surface temperatures selected in a range of 200°–490° C. by direct heating under the regulation of electric power supplied to the halogen lamps. The obtained results are summarized in Table 1.

TABLE 1

| Substrate surface temp. (°C.) | 200 230 0250 260 270 280 300 350 400 440 450 460 470 480 490 |
|---|---|
| Deposition speed (Å/min.) | ←—1000–1500—→|←———————3000–5000———————→ |
| Throughput (wafer/hr) | ←—7–10————→|←————15–30——————→ |
| Si linear defects | ←——not observed——————————————→ |
| Carbon content | ←——not observed——————————————→ |
| Resistivity (μΩcm) | ←—2.7–3.3—→|←————————2.8–3.4——————→ |
| Reflectance (%) | ←—8.5–9.5——→|←————90–95——→|←———ca. 60——→ |
| Hillock (<1 μm) density (cm$^2$) | ←—1–10$^2$—→|←————0–10————→|←—10–10$^4$—→ |
| Spike formation (%) destruction frequency of 0.15 μm junction | ←——0——————————→|←————0–30———→ |

As will be apparent from Table 1, aluminum was deposited in the apertures with a deposition speed as high as 3000–5000 Å/min. at the substrate temperature of 260° C. or higher obtained by direct heating.

The Al film in the apertures, obtained in a substrate surface temperature range of 260° C.–440° C., showed satisfactory characteristics, with no carbon content, a resistivity of 2.8–3.4 μΩcm, a reflectance of 90–95%, a hillock ($\geq 1$ μm) density of 0–10 cm$^2$, and almost zero spike formation (frequency of destruction of 0.15 μm junction).

On the other hand, though the film quality obtained in a surface temperature range of 200°–250° C. was somewhat inferior to that obtained in the temperature range of 260°–440° C., it is considerably better than that obtainable with the conventional technology, but the deposition speed could not exceed 1000–15000 Å/min. and the throughput was in a relative low range of 7–10 wafer/hr.

At a substrate surface temperature equal to or higher than 450° C., the quality of the Al film in the apertures were deteriorated, with a reflectance of 60% or lower a hillock ($\geq 1$ μm) density of 10–10$^4$ cm$^{-2}$ and an alloy spike formation of 0–30%.

In the following there will be explained how the above-explained method can be advantageously applied to apertures such as contact holes or through-holes.

This method can be advantageously applied to the contact holes or through-holes composed of the material in the following.

The Al film formation was conducted on the following substrates (samples) under the same conditions as in the Al film formation on the above-mentioned samples 1-1.

Samples 1-2 were prepared by forming, on monocrystalline silicon constituting a first substrate surface material, a silicon oxide film constituting a second substrate surface material by means of CVD method, and forming apertures by a photolithographic process to locally expose the surface of monocrystalline silicon. The SiO$^2$ film was 8000 Å thick, and the apertures were sized from 0.25×0.25 μm to 100×100 μm. (Such sample will hereinafter be represented as "CVD SiO$_2$ (or simply SiO$_2$)/monocrystalline silicon".)

There were also prepared:

a sample 1-3 of boron-doped oxide film formed by normal pressure CVD (hereinafter written as BSG)/monocrystalline silicon;

a sample 1-4 of phosphor-doped oxide film formed by normal pressure CVD (PSG)/monocrystalline silicon;

a sample 1-5 of boron- and phosphor-doped oxide film formed by normal pressure CVD (BSPG)/monocrystalline silicon;

a sample 1-6 of nitride film formed by plasma CVD (P—SiN)/monocrystalline silicon;

a sample 1-8 of nitride film formed by low pressure CVD (LP—SiN)/monocrystalline silicon; and a sample 1-9 of nitride film formed by ECD (ECR-SiN) /monocrystalline silicon.

Further, samples 1-11 to 1-179 were prepared by taking all the combinations of the first surface materials of 18 kinds and the second surface materials of 9 kinds shown in the following. (It is to be noted that the sample numbers 1-10, 20, 30, 40, 50, 60, 70, 80, 90, 100, 110, 120, 130, 140, 150, 160 and 170 are lacking.) The first surface materials employed were monocrystalline silicon (mono-Si), polycrystalline silicon (poly-Si), amorphous silicon (a-Si), tungsten (W), molybdenum (Mo), tantalum (Ta), tungsten silicide (WSi), titanium silicide (TiSi), aluminum (Al), aluminum silicon (Al≧Si), titanium aluminum (Al—Ti), titanium nitride (Ti—N), copper (Cu), aluminum silicon copper (Al—Si—Cu), aluminum palladium (Al—Pd), titanium (Ti), molybdenum silicide (Mo—Si), and tantalum silicide (Ta—Si). The second substrate surface materials employed were T—$SiO_2$, $SiO_2$, BSG, PSG, BPSG, P—SiN, T—SiN, LP—SiN and ECR—SiN. In all these samples, there could be obtained satisfactory Al films comparable to those in the aforementioned samples 1-1.

Subsequently, the Al was non-selectively deposited by sputtering on the substrates subjected to the selective Al deposition as explained above, and was then patterned.

The Al film obtained by sputtering and the selectively deposited Al film in the apertures showed electrically and mechanically satisfactory contact, because of the improved surface state of the Al film in the apertures.

EXAMPLE 1

Figure 7:
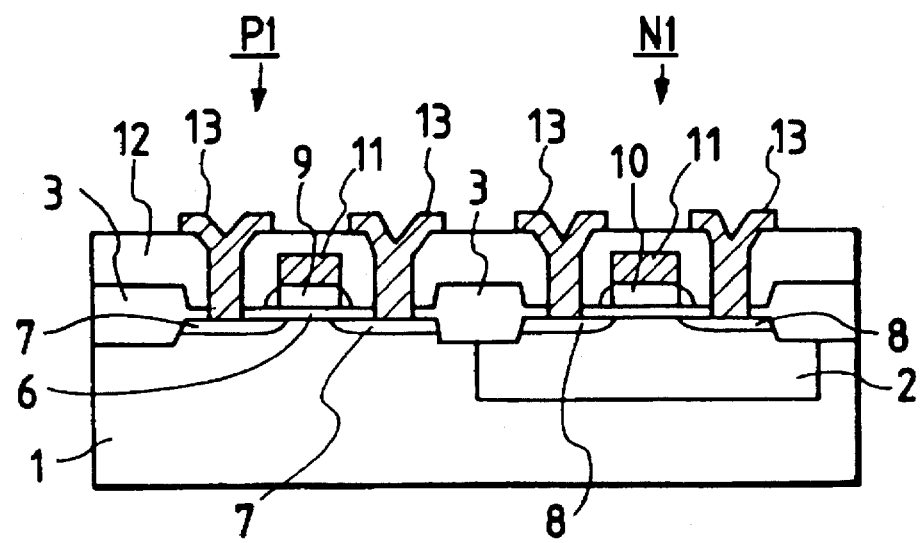
FIGS. 7 and 8 are respectively a schematic cross-sectional view and a schematic plan view of a CMOSFET constituting an embodiment of the present invention.
Figure 8:
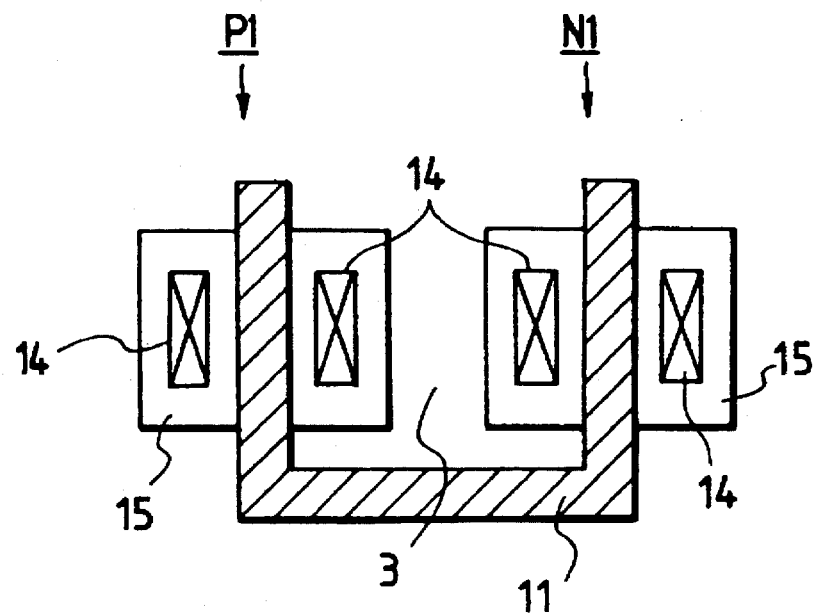

FIGS. 7 and 8 are respectively a schematic cross-sectional view and a plan view of a CMOSFET embodying the present invention, consisting of a P-MOSFET (P1) and an N-MOSFET (N1) formed on an n-type semiconductor substrate such as silicon. More detailedly, the PMOSFET (P1) includes a gate oxide film 6, source-drain areas 7, a p-type gate polysilicon 9, an Al—Si film 11 formed by the aforementioned selective deposition on the polysilicon 9, an interlayer insulation film 12, and source-drain electrodes 13 consisting of Al—Si deposited in contact holes formed in said insulation film 12. Similarly, the NMOSFET (N1) includes a p-type buried layer 2, source-drain areas 8, n-type gate polysilicon 10, an Al—Si film 11 selectively deposited thereon, and source-drain electrodes 13. The PMOSFET and NMOSFET are electrically separated by a separation area 3. The polysilicon areas 9 and 11 are parts, doped in different conductive types, of a continuous polysilicon layer, and the Al—Si film 11 is selectively deposited on the entire area of this polysilicon layer.

In FIG. 8, 14 indicates contact areas of the source-drain electrodes, and 15 indicates the boundary between the field oxide film 3 and the transistor active area. The source-drain electrode 14 are preferably formed also by the selective deposition method explained above.

Now reference is made to FIGS. 9 to 12, for explaining the method for producing the MOSFVET shown in FIGS. 7 and 8.

Figure 9:
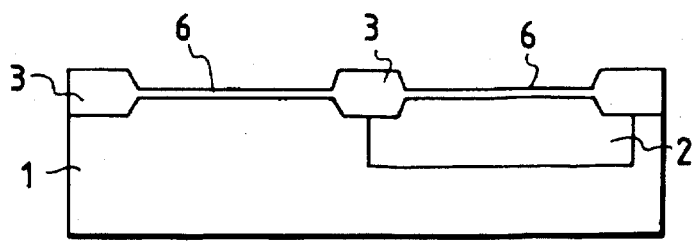
FIGS. 9 to 12 are schematic cross-sectional views showing the producing method therefor.

At first a predetermined area of an n-type substrate 1 with an impurity concentration of $10^{14}$–$10^{16}$ $cm^{-3}$ was subjected to implantation of $B^+$ ions with a dose of $10^{12}$–$10^{13}$ $cm^{-2}$, followed by a heat treatment at 1100°–1200° C. to form a p-area 2. Then a separation area 3 was formed by a LOCOS process, and a gate oxide film 6 of a thickness of 100–350 Å was formed (FIG. 9). Subsequently ion implantation was conducted in ordinary manner, in order to control the threshold voltage and the source-drain voltage resistance.

Figure 10:
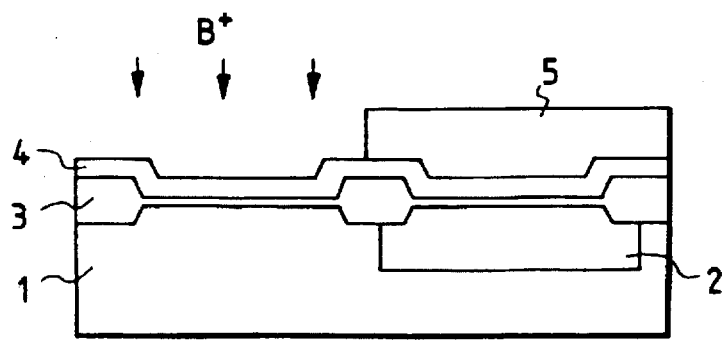
Figure 11:
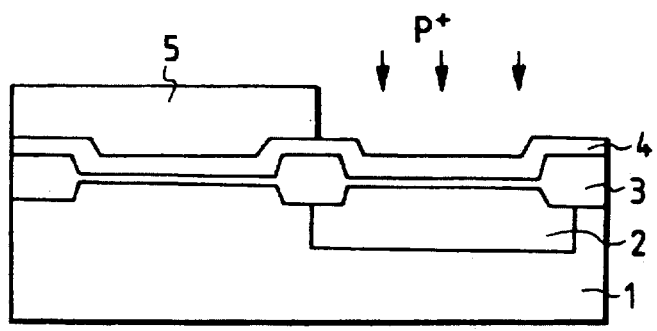

Then a polysilicon layer of a thickness of 1500–4500 Å was deposited by LPCVD, then an area where the NMOSFET was to formed was covered with photoresist 5, and $B^+$ ions were implanted with a dose of $10^{14}$–$3\times10^{-15}$ $cm^{-2}$ only in the area of PMOSFET (FIG. 10). The photoresist in the NMOSFET area was stripped, the PMOSFET area was newly covered with photoresist, and $P^+$ ions were implanted with a dose of $5\times10^{14}$–$10^{16}$ $cm^{-2}$ (FIG. 11). Subsequently heat treatment was conducted at 900°–1000° C.

After patterning of the polysilicon, the surface and the lateral faces of polysilicon layers 9, 10 were oxidized. Then $BF_2^+$ ions were implanted with a dose of $10^{15}$–$3\times10^{15}$ $cm^{-2}$ in order to form the source-drain areas 8 of NMOSFET. Thus, the source-drain areas can be formed in self-aligning manner. Then thermal treatment was conducted at 800°–1000° C., and the surfacial oxide film of the polysilicon areas 9, 10 was eliminated by etch back (FIG. 12).

Figure 12:
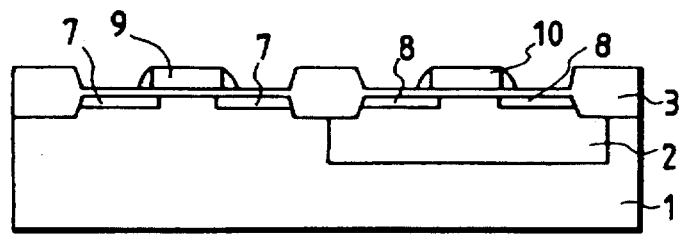

On the thus treated semiconductor substrate, the polysilicon layers 9, 10 and the oxide film exist together as shown in FIG. 12. Among the above-explained Al—CVD method, a low pressure CVD employing DMAH, $Si_2H_6$ and hydrogen as the reaction gas was conducted to selectively deposit an Al—Si film solely on the polysilicon layers 9, 10, thereby forming a multi-layered film of polysilicon an AlSi.

Subsequently the CMOSFET shown in FIG. 7 was prepared by depositing the interlayer insulation film 12 by CVD, opening contact holes on the source-drain areas of MOSFET, and depositing Al—Si 13 in said contact holes by selective deposition. A multi-layered wiring structure may be formed by forming a second interlayer insulation film on the structure shown in FIG. 7. This can be achieved by opening through-holes reaching the gate metal electrodes 11 or source-drain electrodes 13 in said second insulation film, filling the through-holes with Al—Si or Al by selective deposition, forming for example an Al—Si film on the second interlayer insulation film by a non-selective depositing method such as sputtering, effecting a patterning step in an ordinary manner and forming a passivation film.

Figure 13:
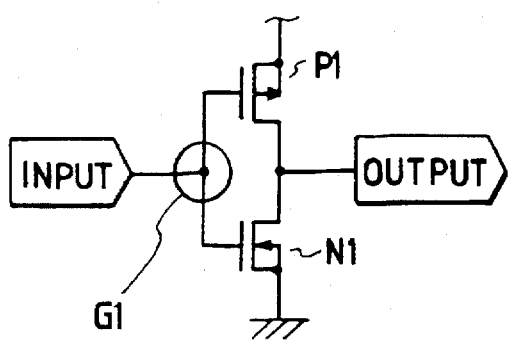
FIG. 13 is a circuit diagram of an inverter circuit embodying the present invention.

The CMOSFET thus prepared can be utilized as an inverter as shown in FIG. 13. In FIG. 13, an area below the gate electrode of the PMOSFET is composed of p-polysilicon, while an area below the gate electrode of the NMOSFET is composed of n-polysilicon. When polysilicon is used as the electrode, a pn junction is formed therein so that it has been impossible to utilize polysilicon as a wiring. However, the present embodiment has enabled the use of polysilicon as a wiring, for example for a common gate of a CMOS structure, since Al—Si metal is selectively deposited on the polysilicon.

Figure 15:
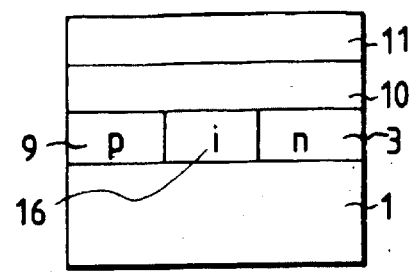
FIGS. 14 to 16 are views showing laminate structures according to the present invention.
Figure 14:
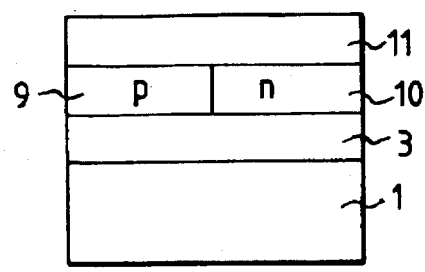

FIG. 14 is a cross-sectional view of a gate wiring G1 of PMOSFET and NMOSFET in FIG. 13. In the present example the p-area 9 and the n-area 10 in polysilicon are in mutual contact, but there may be formed an undoped (i-type) are 16 therebetween as shown in FIG. 15.

Figure 16:
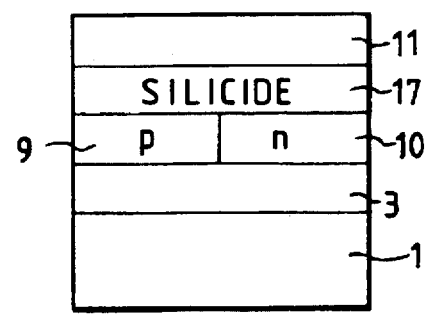

As the above-explained selective Al—Si depositing method can selectively deposit Al—Si not only on silicon but also on silicides such as $WSi_2$, $MoSi_2$, $TiSi_2$ or $TaSi_2$, the wiring may also be formed, as shown in FIG. 16, by forming a silicide 17 o the polysilicon layers, 9, 10 and selectively depositing an Al—Si film 11 thereon.

The ion implantation into polysilicon and the ion implantation for source-drain formation for MOSFET in the present example are conducted in separate steps, but these ion implantations may be in a same step.

It is furthermore possible to use a multi-layered film of polysilicon and Al—Si for the lead electrodes for the source-drain of MOSFET, as int eh gate electrodes.

Figure 17:
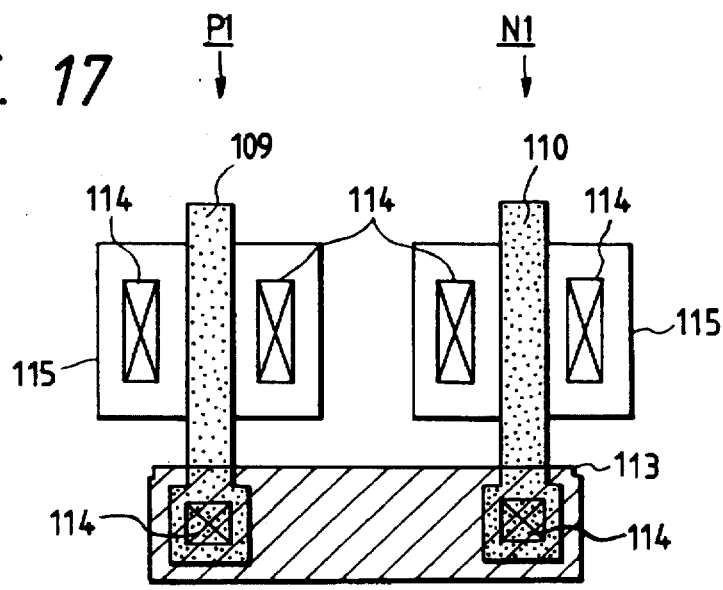
FIG. 17 is a plan view of a COMOSFET obtained by a conventional method.

FIG. 17 shows, for the purpose of comparison, a CMOS-FET prepared by a conventional process, in a plan view. At the sides of PMOS (P1) and NMOS (N1), there are respectively formed polysilicon gates 109, 110 doped in p-type and n-type, and these gates are connected to an upper Al layer 113 through contacts 114 in through-holes formed in the interlayer insulation film. In such conventional example, a polysilicon wiring with a thickness of 4000 Å, a length of 10 μm and a width of 2 μm had a resistance of 50–200Ω. On the other hand, a wiring of the present invention with a polysilicon layer of a thickness of 2000 Å and an Al—Si (or Al) layer with a thickness of 4000 Å significantly reduced the resistance to 1Ω or less. Consequently, the switching speed of the CMOS inverter can be significantly increased. Also according to the present invention, since Al—Si is directly deposited on a single polysilicon layer including the portions of different conductive types, the connecting part between Al—Si and polysilicon, as in the conventional structure shown in FIG. 17, can be eliminated. It is therefore possible to eliminate unnecessary areas in the circuit layout. The production yield is not deteriorated by this fact, and the design freedom is increased considerably since n$^+$-polysilicon and p$^+$-polysilicon can be freely connected in the circuit. This fact contributes greatly to the improvement of circuit performance and the reduction of period required for circuit development.

EXAMPLE 2

Figure 18:
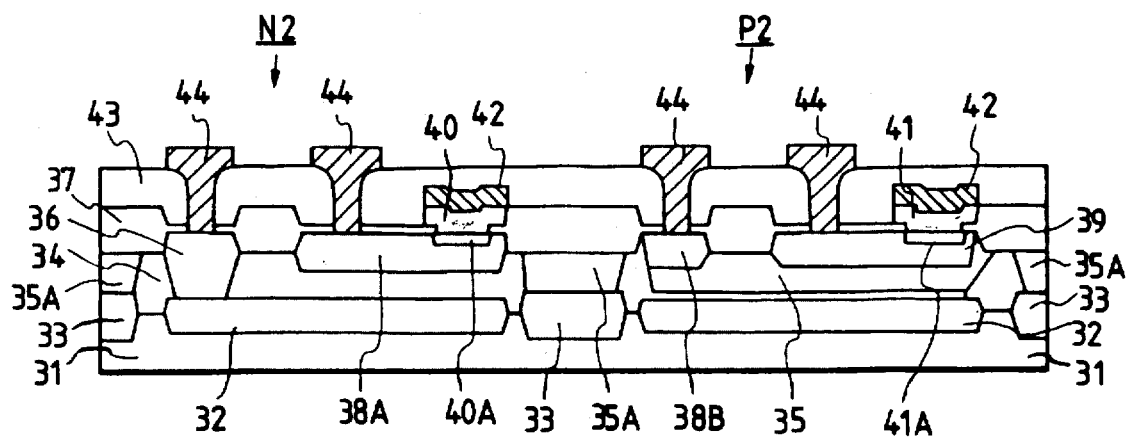
FIGS. 18 and 19 are respectively a schematic cross-sectional view and a schematic plan view of a bipolar transistor embodying the present invention.
Figure 19:
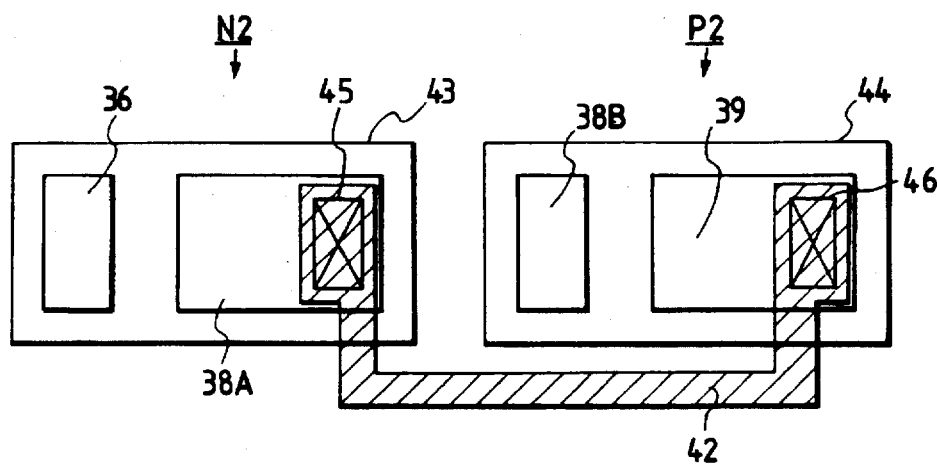

FIG. 18 is a schematic plan view of an example of bipolar transistor embodying the present invention, and FIG. 19 is a plan view thereof.

This example has an npn transistor N2 and a pnp transistor P2 formed on a semiconductor substrate 31 composed for example of monocrystalline silicon. More detailedly, the substrate 31 is provided with an n$^+$-buried layer 32 and a p$^+$-buried layer 33, and the npn transistor (N2) includes an n-type collector lead layer 36 formed in an aperture in an n-epitaxial layer 34, a base layer 38A formed on the n-epitaxial layer 34, an emitter electrode penetrating through an oxide film 37 and composed of polysilicon 40 and an Al—Si film 44 formed thereon, and collector and base Al—Si electrodes 44 connected to the wirings on an interlayer insulation film 43. Under the polysilicon layer 40 there is formed a diffusion layer 40A. Similarly the pnp transistor (P2) includes a collector area 35, a collector contact 38B, a base layer 39, a polysilicon layer 41 constituting an emitter electrode, an Al—Si layer 42 selectively deposited thereon, collector and base Al—Si electrodes 44, and a diffusion layer 41A. The npn transistor N2 and the pnp transistor P2 are electrically separated by a p-type isolation area 35A.

In FIG. 19, 43 and 44 are isolation areas for the npn and pnp transistors, and 45 and 46 are contact areas of the emitter electrodes of the transistors.

In the following there will be explained the method for producing the device of the present example, with reference to FIGS. 20 to 25.

Figure 20:
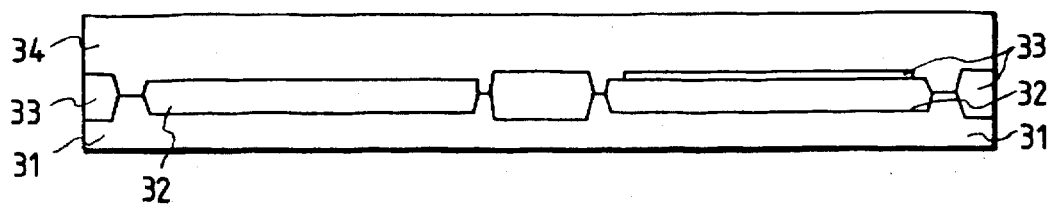
FIGS. 20 to 25 are schematic cross-sectional views showing the producing method thereof.

At first the n-buried layer 32 and the p-buried layer 33 were formed by an ordinary method on a p-silicon substrate 31 with an impurity concentration of $10^{14}10^{16}$ cm$^{-3}$. Then, as the collector area of the npn transistor, an n-epitaxial layer 34 was deposited with a thickness of 1–5 μm and with an impurity concentration of $10^{15}$–$10^{16}$ cm$^{-3}$, by epitaxial growth (FIG. 20).

Figure 21:
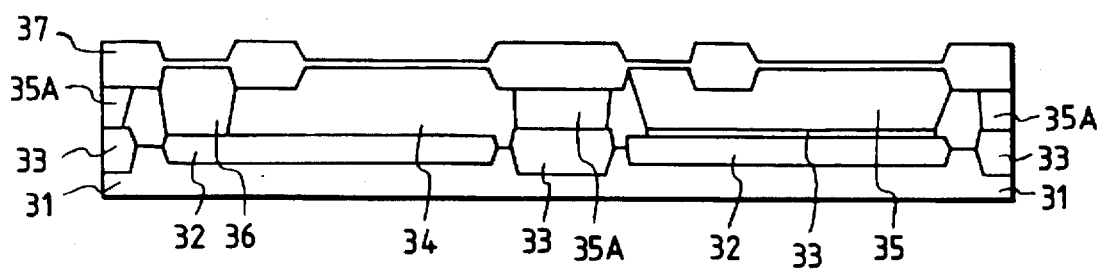

Then B$^+$ ions were implanted with a dose of $10^{12}$–$10^{13}$ cm$^{-2}$ to form the collector area 35 of the pnp transistor and the p-type isolation area 35A. Also P$^+$ ions were implanted with a dose of $10^{15}$–$10^{16}$ cm$^{-2}$ for forming the n-type collector lead layer 36, for reducing the collector resistance of the pnp transistor. Subsequently a thick oxide film 37 was formed by LOCOS process (FIG. 21).

Figure 22:
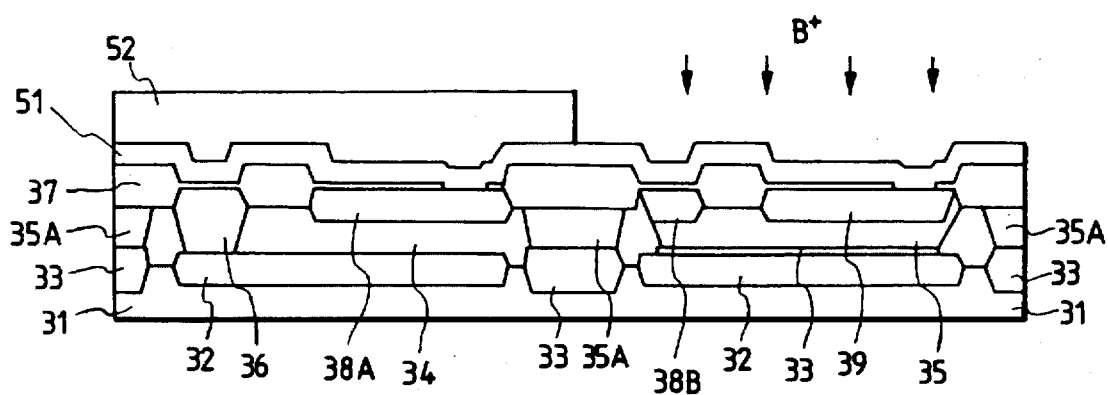

Subsequently the base area 38A of the npn transistor and the collector contact 38B of the pnp transistor were formed by B$^+$ ion implantation with a dose of $10^{13}10^{14}$ cm$^{-2}$, and the base area 39 of the pnp transistor was formed by P$^+$ ion implantation with a dose of $10^{13}$–$10^{14}$ cm$^{-2}$. Then, after apertures were formed in the oxide film of the emitter portions of the npn and pnp transistors, the polysilicon layer 51 was deposited. The area of the npn transistor was covered with photoresist 52, and B$^+$ ions were implanted with a dose of $5\times10^{14}$–$5\times10^{15}$ cm$^{-2}$ into the are of the pnp transistor (FIG. 22).

Figure 23:
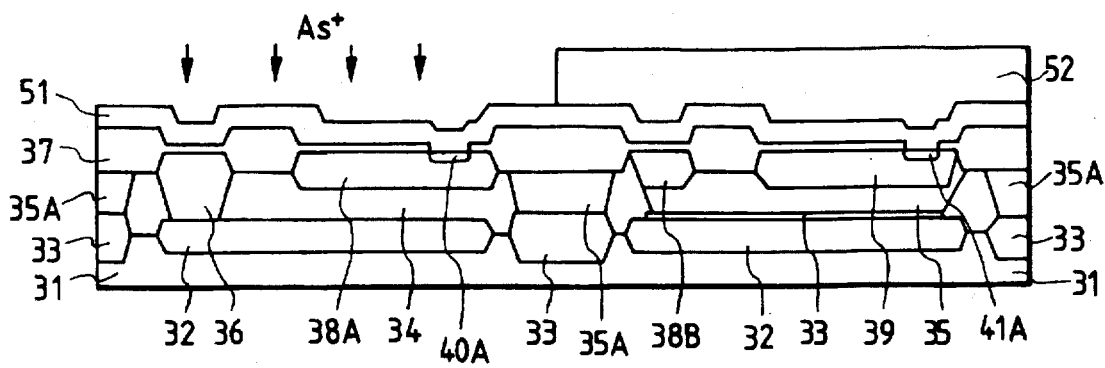

Thereafter the photoresist of the npn transistor area was stripped, then the pnp transistor area was covered anew with photoresist 52, and As$^+$ ions were implanted with a dose of $10^{15}$–$10^{16}$ cm$^{-2}$ into the polysilicon layer of the npn transistor area. Then a heat treatment was conducted at 900°–1000° C. in order to diffuse the impurity of the polysilicon layer into the semiconductor substrate (FIG. 23).

Figure 24:
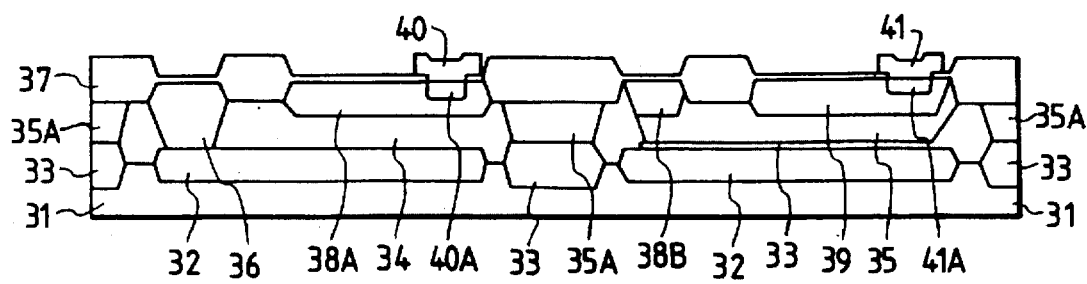

Subsequently the polysilicon layer was patterned to form the emitter electrode polysilicon layer 40 for the npn transistor and the emitter electrode polysilicon layer 41 of the pnp transistor (FIG. 24).

Figure 25:
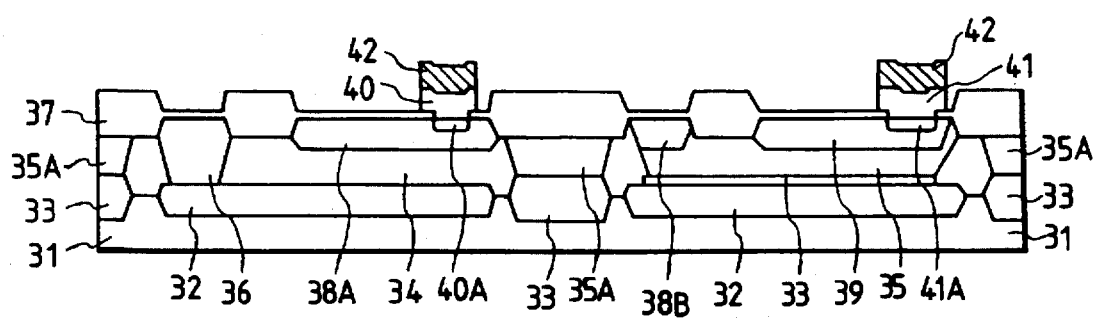

Onto the polysilicon layers 40, 41, Al—Si films 42 were selectively deposited by the aforementioned Al—CVD method, utilizing DMAH gas, Si$_2$H$_6$ and H$_2$ with the substrate surface maintained at 270° C. (FIG. 25).

The bipolar transistors shown in FIG. 18 were completed thereafter by depositing the interlayer insulation film 43 by CVD, opening contact holes on the collectors and the bases, and selectively depositing the Al—Si layer 44 similarly as the Al—Si film 42 for the emitter electrode. In the structure shown in FIG. 18, it is possible to form wirings connected to the electrodes 44 by non-selectively deposition an Al—Si film for example by sputtering on the insulation film 43 and effecting a patterning step. Similarly multi-layered wirings connected to the Al—Si films 42 may be formed.

Figure 26:
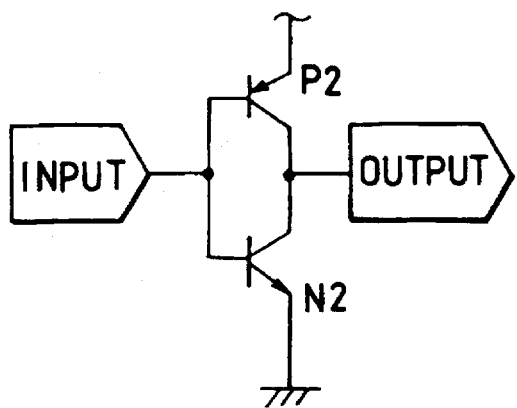
FIG. 26 is a circuit diagram of a buffer circuit embodying the present invention.

The bipolar transistors thus formed may be utilized as a buffer circuit as shown in FIG. 26.

In FIG. 26, the emitter of the pnp transistor is composed of p-polysilicon and Al—Si film, while the emitter of the npn transistor is composed of n-polysilicon and Al—Si film. In the present example, the laminate film composed of polysilicon and Al—Si is utilized in the emitters of the bipolar transistors, but it may also be used in the collector lead electrodes.

Also as explained in the first example, the structure of the polysilicon layer and the Al—Si film at the boundary of the p- and n-areas can be any of the structures shown in FIGS. 14, 15 and 16.

Figure 27:
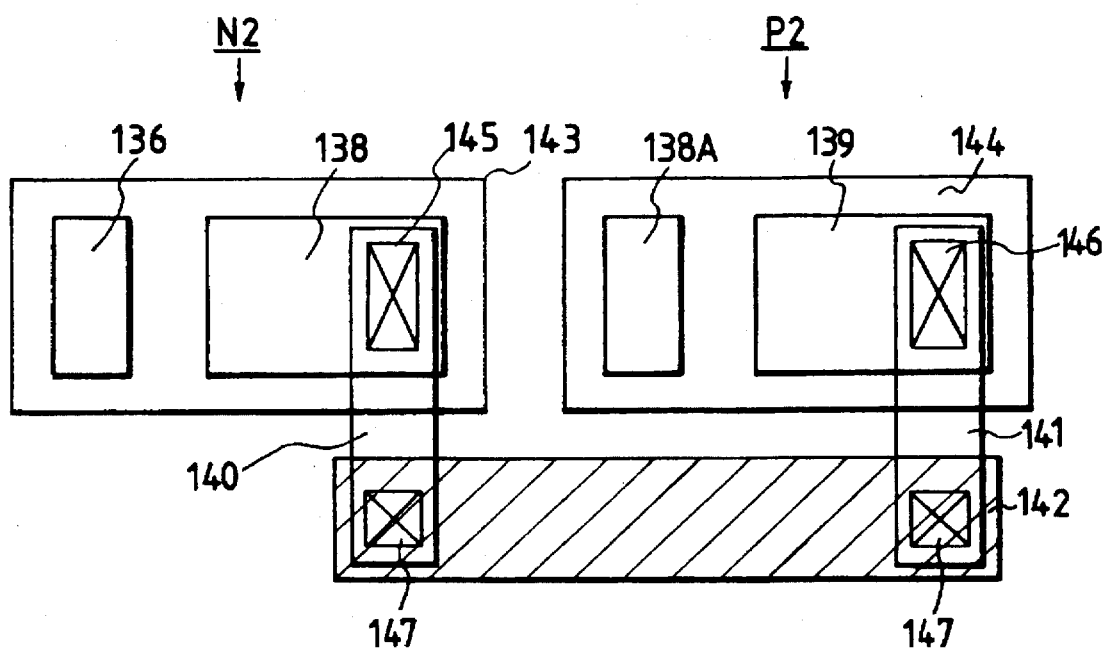
FIG. 27 is a plan view of a bipolar transistor obtained by a conventional method.

FIG. 27 illustrates, for the purpose of comparison, bipolar transistors of a similar structure, prepared by a conventional process. The npn transistor N2 includes an n⁺-collector 136, a p-base 138, an n⁺emitter contact 145 and an n⁺-polysilicon layer 140. On the other hand, the pnp transistor P2 includes a p⁺collector 138A, an n-base 139, a p⁺-emitter contact 146, and a p⁺-polysilicon layer 141. The polysilicon layers 140, 141 are connected to an upper Al wiring layer 142, through contacts 147 in through-holes formed in the interlayer insulation film. As will be apparent from comparison of FIGS. 19 and 27, the conventional structure involves a longer polysilicon wiring with a higher resistance. On the other hand, according to the present invention, the Al—Si film deposited on polysilicon can reduce the resistance, so that said bipolar transistors can significantly reduce the switching speed when they are utilized in an inverter circuit. Also as explained in the example 1, there can be achieved improvement in the level of integration and an increase in the freedom in circuit design.

In the foregoing examples, the Al—Si film is selectively deposited on polysilicon. However it is also possible to convert polysilicon into a monocrystalline state by laser annealing or electron beam annealing, and to selectively deposit the Al—Si film on such monocrystalline area. As an Al—Si film of improved crystallinity can be grown on monocrystalline silicon, the migration resistance can be further improved.

In addition to aluminum and metals principally composed of aluminum, it is also possible to selectively deposit a Cu film with copper bisacetylacetonate or copper bisdipyvaloylmethanate and $H_2$, or a Mo film with $Mo(CH_3)_6$ or $Mo(CO)_6$, or a W film with $W(CH_3)_6$, or an alloy film thereof on silicon, there by obtaining similar effects as in the foregoing examples.

It is furthermore possible to form bipolar transistors and MOSFET's on the same substrate by combining the first and second examples.

As explained in the foregoing, the present invention allows a reduction in the wiring resistance and satisfactory matching in a complementary circuit, by doping a silicon layer, for example a polysilicon layer, with impurities of different conductive types, and selectively depositing a metal film thereon.

Also it enables the use of polysilicon for both contacts and wirings, thereby providing the production yield, reducing the chip size and improving the level of integration.

Also the possibility of connection of N⁺-polysilicon and p⁺-polysilicon in the circuit significantly increases the freedom of circuit designing, thereby contributing to the improvement in the circuit performance and to the reduction in the period required for device development.

We claim:

1. A method for producing a semiconductor device comprising the steps of:
    forming on a semiconductor substrate a first electrode made of a semiconductor of a first conductivity type for defining a first gate electrode of a PMOS transistor;
    forming on said semiconductor substrate a second electrode made of a semiconductor of a second conductivity type different from the first type for defining a second gate electrode of an NMOS transistor; and
    depositing a common metal layer selectively on the whole surface of first and second electrodes side by side, to form a composite gate electrode for a CMOS transistor consisting essentially of said PMOS and NMOS transistors.

2. A method according to claim 1, wherein the first electrode is a P-type polysilicon, and the second electrode is N-type polysilicon.

3. A method according to claim 1, wherein, between the first and second electrodes, an intrinsic semiconductor is provided side by side.

4. A method according to any one of claims 1–3, wherein the metal layer is formed by a CVD process using alkylaluminum hydride and $H_2$.

5. A method according to any one of claims 1–3, wherein the metal layer is formed by a CVD process using dimethylaluminum hydride and $H_2$.

6. A method of producing a semiconductor integrated circuit comprising a P-channel field effect transistor having a first gate, an N-channel field effect transistor having a second gate, and an insulating layer extending over both the first and second gates, said method comprising the steps of:
    forming the first gate by (1) forming a first gate insulating film contacting a region between source and drain regions of the P-channel transistor, (2) forming a first semiconductor layer of a first conductivity type over the first gate insulating film and (3) selectively depositing a first metal layer over the first semiconductor layer;
    forming the second gate by (1) forming a second gate insulating film contacting a region between source and drain region of the N-channel transistor, (2) forming a second semiconductor layer of a second conductivity type opposite to the first conductivity type over the second gate insulating film and (3) selectively depositing a second metal layer over the second semiconductor layer, and
    selectively depositing a metal layer on a whole surface of the first and second semiconductor layers,
    wherein the first semiconductor layer directly contacts the second semiconductor layer, and the first and second metal layers form a common metal layer directly contacting the first and second semiconductor layers.

7. A method of producing a semiconductor device comprising the steps of:
    forming a first semiconductor region of a first conductivity type for defining a first emitter of an npn transistor on a substrate;
    forming a second semiconductor region of a second conductivity type, opposite to said first conductivity type, for defining a second emitter of a pnp transistor on the substrate; and
    forming a wiring connecting the first and second regions by (1) providing a first semiconductor portion of the first conductivity type at the first region, (2) providing a second semiconductor portion of the second conductivity type at the second region and (3) selectively depositing, on the whole surface of the first and second semiconductor portions, a common metal layer directly contacting each of the first and second portions without passing through an aperture in an insulating layer.

8. A method of producing a semiconductor device according to claim 7, wherein the first portion is composed of polycrystalline silicon.

9. A method of producing a semiconductor device according to claim 7, wherein the second portion is composed of aluminum or a metal principally composed of aluminum.

10. A method of producing a semiconductor device according to claim 6, wherein the wiring connects gates of a PMOS transistor and a NMOS transistor of a CMOS circuit.

11. A method of producing a semiconductor device according to claim 7, wherein the wiring connects respective emitters or respective collectors of a pnp transistor and a npn transistor.

12. A method of producing a semiconductor device according to claim 6, wherein the metal layers are selectively deposited by a CVD deposition process using alkylaluminum hydride and hydrogen.

13. A method of producing a semiconductor device according to claim 6, wherein the metal layers are selectively deposited by a CVD deposition process using dimethylaluminum hydride and hydrogen.

14. The method of producing a semiconductor device according to claim 7, wherein the common metal layer is selectively deposited by a CVD deposition process using alkylaluminum hydride and hydrogen.

15. The method of producing a semiconductor device according to claim 7, wherein the common metal layer is selectively deposited by a CVD deposition process using dimethyl aluminum hydride and hydrogen.

* * * * *

UNITED STATES PATENT AND TRADEMARK OFFICE
CERTIFICATE OF CORRECTION

PATENT NO. : 5,700,719

DATED : December 23, 1997

INVENTOR(S): HIROSHI YUZURIHARA, ET AL.

It is certified that error appears in the above-identified patent and that said Letters Patent is hereby corrected as shown below:

ON THE TITLE PAGE AT [57], ABSTRACT

Line 3, "he" should read --the--.

COLUMN 3

Line 14, "IN" should read --In--;
Line 32, "present" should read --presence--;
Line 59, "ont he" should read --on the--;
Line 61, "electro/siring" should read --electrode/wiring--.

COLUMN 4

Line 6, "int he" should read --in the--;
Line 11, "Al-DVD" should read --Al-CVD--;
Line 30, "ont he" should read --on the--;
Line 40, "Al-cu" should read --Al-Cu--;
Line 43, "Al-CVE" should read --Al-CVD--;
Line 46, "IN" should read --In--;
Line 60, "pursue" should read --pressure--;
Line 61, "316a316e." should read --316a-316e.--;
Line 66, "s" should read --a--.

COLUMN 5

Line 5, "s" should read --as--;
Line 11, "the" should read --The--;
Line 19, "to capable" should read --to be capable--;
Line 37, "he" should read --the--;
Line 63, "my" should read --may--.

UNITED STATES PATENT AND TRADEMARK OFFICE
CERTIFICATE OF CORRECTION

PATENT NO. : 5,700,719

DATED : December 23, 1997

INVENTOR(S): HIROSHI YUZURIHARA, ET AL.

It is certified that error appears in the above-identified patent and that said Letters Patent is hereby corrected as shown below:

COLUMN 6

Line 18, "place" should read --placed--;
Line 34, "5.0 X $10^{o3}$" should read --5 X $10^{-3}$--.

COLUMN 8

Table 1, "0250" should read --250-- (across from "Substrate surface temp. (°C.)"), and "Hillock (<1$\mu$m)" should read --Hillock (>1$\mu$m)--.
Line 63, "$SiO^2$" should read --$SiO_2$--.

COLUMN 9

Line 23, "(Al$\geq$Si)," should read (Al-Si),--

COLUMN 10

Line 13, "-3x$10^{-15}$" should read --3x$10^{15}$--;
Line 33, "an AlSi" should read --and Al-Si--;
Line 64, "are 16" should read --area 16--.

COLUMN 11

Line 2, "o" should read --on--;
Line 10, "int eh" should read --in the--;
Line 36, "fort" should read --for--.

UNITED STATES PATENT AND TRADEMARK OFFICE
CERTIFICATE OF CORRECTION

PATENT NO. : 5,700,719

DATED : December 23, 1997

INVENTOR(S): HIROSHI YUZURIHARA, ET AL.

It is certified that error appears in the above-identified patent and that said Letters Patent is hereby corrected as shown below:

COLUMN 12

Line 3, "$10^{14}10^{16}$" should read --$10^{14}$-$10^{15}$--;
Line 17, "$10^{13}10^{14}$" should read --$10^{13}$-$10^{14}$--;
Line 24, "are" should read --area--;
Line 48, "deposition" should read --depositing--.

COLUMN 13

Line 44, "$N^+$" should read --$n^+$--.

Signed and Sealed this

Seventh Day of July, 1998

Attest:

BRUCE LEHMAN

Attesting Officer  Commissioner of Patents and Trademarks